(12) United States Patent
Lee et al.

(10) Patent No.: US 10,747,374 B2
(45) Date of Patent: Aug. 18, 2020

(54) TOUCH CONTROL DEVICE

(71) Applicant: HYUNDAI MOTOR COMPANY, Seoul (KR)

(72) Inventors: Jong Bok Lee, Suwon-si (KR); Donghee Seok, Seoul (KR); Gideok Kwon, Seoul (KR); HeeJin Ro, Seoul (KR)

(73) Assignee: Hyundai Motor Company, Seoul (KR)

( * ) Notice: Subject to any disclaimer, the term of this patent is extended or adjusted under 35 U.S.C. 154(b) by 603 days.

(21) Appl. No.: 15/431,213

(22) Filed: Feb. 13, 2017

(65) Prior Publication Data

US 2018/0120970 A1 May 3, 2018

(30) Foreign Application Priority Data

Nov. 3, 2016 (KR) .......................... 10-2016-0145574

(51) Int. Cl.
| | |
|---|---|
| *G06F 3/044* | (2006.01) |
| *H03K 17/96* | (2006.01) |
| *G06F 3/02* | (2006.01) |
| *H03K 17/98* | (2006.01) |
| *H03K 17/955* | (2006.01) |
| *G06F 3/041* | (2006.01) |
| *G06F 3/045* | (2006.01) |

(52) U.S. Cl.
CPC ............... *G06F 3/044* (2013.01); *G06F 3/02* (2013.01); *G06F 3/0202* (2013.01); *G06F 3/0416* (2013.01); *H03K 17/955* (2013.01); *H03K 17/9622* (2013.01); *H03K 17/98* (2013.01); *G06F 3/045* (2013.01); *G06F 2203/04107* (2013.01); *H03K 2217/94036* (2013.01); *H03K 2217/96054* (2013.01); *H03K 2217/9655* (2013.01)

(58) Field of Classification Search
CPC ..... H01H 2239/006; H01H 2003/0293; H01H 2239/074; H01H 13/83; G06F 3/044; G06F 2203/04103; G06F 2203/04111
See application file for complete search history.

(56) References Cited

U.S. PATENT DOCUMENTS

| | | | |
|---|---|---|---|
| 9,087,663 B2 | 7/2015 | Los | |
| 2012/0186958 A1* | 7/2012 | Yang | ..................... G06F 1/1671 |
| | | | 200/314 |
| 2014/0340317 A1* | 11/2014 | Rodzeveski | ........... G06F 3/048 |
| | | | 345/173 |
| 2015/0129408 A1* | 5/2015 | Sergi | .................... H03K 17/962 |
| | | | 200/600 |

FOREIGN PATENT DOCUMENTS

| | | |
|---|---|---|
| JP | 2014-525131 A | 9/2014 |
| KR | 10-2008-0110477 A | 12/2008 |
| KR | 10-2015-0001910 A | 1/2015 |
| KR | 10-1545019 B1 | 8/2015 |
| KR | 10-1644089 B1 | 7/2016 |

* cited by examiner

*Primary Examiner* — Ahmed M Saeed
(74) *Attorney, Agent, or Firm* — Morgan, Lewis & Bockius LLP

(57) ABSTRACT

A touch control device comprises: a button member receiving a touch input; a body member located below the button member; a signal deliverer arranged in the body member for having capacitance changed according to the touch input; a substrate having a receiver which is arranged on the substrate for receiving information about the capacitance from the signal deliverer; and a light emitting member for irradiating light onto the button member.

15 Claims, 12 Drawing Sheets

TOUCH CONTROL DEVICE

CROSS-REFERENCE TO RELATED APPLICATION

This application claims the benefit of priority to Korean Patent Application No. 10-2016-0145574, filed on Nov. 3, 2016, the disclosures of which is incorporated herein by reference in its entirety.

TECHNICAL FIELD

The present disclosure relates to a touch control device, and more particularly, to a touch control device allowing touch inputs while emitting light.

BACKGROUND

To implement a touch control device capable of being manipulated by a touch of a user, resistive, capacitive, surface acoustic wave, transmitter methods, etc., are used.

A touch control device using the capacitive method includes a type that forms crossing electrode patterns and detects an input position by sensing a change in capacitance between the electrodes when an input means, such as a finger comes into contact with the touch control device. There is another type that applies the same electric potential of a phase to both terminals of a transparent conductive film and detects an input position by sensing a small current that flows when a capacitance is formed by an input means, such as a finger coming into contact with or approaching the touch control device.

In general, the touch control device has a 2-panel layered structure in which a first panel including a number of first metal patterns that electrically connect first sensing patterns arranged in the first direction, e.g., in the x-axis direction, to a sensor circuit for calculating positions of the first sensing patterns on a first substrate, and a second panel including a number of second metal patterns that electrically connect second sensing patterns arranged in the second direction, e.g., in the y-axis direction, to a sensor circuit for calculating the positions of the second sensing patterns are stuck together by an adhesive.

Furthermore, a capacitive touch panel with a single 2-layered structure been disclosed.

As a method for manufacturing the touch control device, a method to use indium tin oxide (ITO), which is the transparent electrode, a method to use metal mesh, a method to use a flexible printed circuit board (FPCB), or the like, to be applied to the touch panel is used.

However, the above methods require multiple processing steps, making it complicated and expensive. Particularly, the ITO-based manufacturing process uses rare-earth elements, and thus has a problem of increased product costs due to the valuable materials.

In addition, the existing processes use an adhesion method, which makes the product vulnerable to external vibration, shocks, or high heat. Accordingly, the processes decrease product durability and are hard to be applied to the devices exposed to vibration and high temperature.

SUMMARY

The present disclosure provides a touch control device with electrodes formed without using adhesion methods.

The present disclosure also provides a touch control device with metal buttons.

The present disclosure also provides a touch control device with a light transfer member.

In addition, the present disclosure provides a touch control device with both physical buttons and touch buttons used in a single structure.

In accordance with an embodiment of the present disclosure, a touch control device comprising: a button member receiving a touch input; a body member located below the button member; a signal deliverer arranged in the body member for having a capacitance changing according to the touch input; a substrate having a receiver which is arranged on the substrate for receiving information about the capacitance from the signal deliverer; and a light emitting member for irradiating light onto the button member.

The body member has a side including a metal complex, in which an electrode groove is formed, and wherein the signal deliverer having a conductive material is arranged in the electrode groove.

The body member comprises resin including one or more of Polycarbonate (PC), Polyamide (PA), and acrylonitrile-butadiene-styrene copolymer (ABS), and metal oxide including one or more of Mg, Cr, Cu, Ba, Fe, Ti, and Al.

The body member is formed by coating a side of a basic member with a base including the metal complex.

The button member is formed of a metal.

The touch control device further comprising: a shielding member arranged to isolate the button member from the signal deliverer.

The touch control device further comprising: a controller for determining the information about the capacitance received from the receiver.

The controller is configured to determine whether an input means comes into contact with the button from the information about the capacitance between the signal deliverer and the receiver.

The controller is configured to determine whether an input means approaches the button within a predetermined range from the information about the capacitance between the signal deliverer and the receiver.

The button member forms an opening, further comprising: a light transfer member arranged between the light emitting member and the opening, wherein the light from the light emitting member is exposed to the opening through the light transfer member.

The signal deliverer comprises a first signal deliverer arranged on the top face of the body member, and a second signal deliverer having one end connected to the first signal deliverer and the other end approaching or contacting the receiver.

The light transfer member is arranged to bore through the body member, and wherein the signal deliverer comprises a first signal deliverer arranged on the top face of the body member through which the light transfer member bores, and a second signal deliverer having one end connected to the first signal deliverer and the other end approaching or contacting the receiver.

The body member is arranged to be separated from the substrate, further comprising: an elastic member inserted between the body member and the substrate, wherein the button member and the body member are arranged to be movable in the vertical direction to press the elastic member.

The button member forms an opening, further comprising: a light transfer member arranged between the light emitting member and the opening, wherein the light from the light emitting member is exposed to the opening through the light transfer member, and wherein the elastic member is placed between the light transfer member and the light emitting member installed on the substrate.

The light transfer member is arranged to bore through the body member, and the body member forms an inclined face around the light transfer member, and wherein the signal deliverer comprises a first signal deliverer arranged on the inclined face, and a second signal deliverer having one end connected to the first signal deliverer and the other end approaching or contacting the receiver.

Some area of the first signal deliverer is arranged to face the opening of the button member.

The light transfer member is arranged to bore through the body member, and wherein the signal deliverer comprises a first signal deliverer arranged on a face adjacent to the button member, and a second signal deliverer extending around a through part of the body member, through which the light transfer member bores, to approach or contact the receiver.

In accordance with an another embodiment of the present disclosure, a touch control device comprising: a button member forming a touch area in which a touch input is received, and formed of a metal; a substrate having a receiver which is arranged on the substrate for receiving a touch signal of the touch input; a body member disposed between the button member and the substrate; and a signal deliverer having a first signal deliverer arranged in the body member to have a capacitance changing by a touch input and arranged to be adjacent to the button member, and a second signal deliverer extending from the first signal deliverer along the button member, wherein the receiver receives information about the capacitance of the signal deliverer changed by the touch input.

The button member forms an opening through which light passes, further comprising: a light emitting member for irradiating light to the opening, and a light transfer member arranged between the opening and the light emitting member for allowing the light from the light emitting member to pass through.

The light transfer member is arranged to bore through the body member, and wherein the first signal deliverer is arranged around a through part of the body member, through which the light transfer member bore.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Reference will now be made in detail to embodiments, examples of which are illustrated in the accompanying drawings. The following description is provided to assist in a comprehensive understanding of exemplary embodiments of the disclosure as defined by the claims and their equivalents. It includes various specific details to assist in that understanding but these are to be regarded as merely exemplary. Accordingly, those of ordinary skilled in the art will recognize that various changes and modifications of the embodiments described herein can be made without departing from the scope and spirit of the disclosure.

A touch control device is a means for receiving signals by touch or contact (or proximity) of an input means, such as a finger of the user or a touch pen, and determining a position of the touch (or proximity).

A touch control device in accordance with an embodiment of the present disclosure may be implemented to have buttons or switches.

A structure of a touch control device will now be described in connection with FIGS. 1 to 3.

Figure 1:
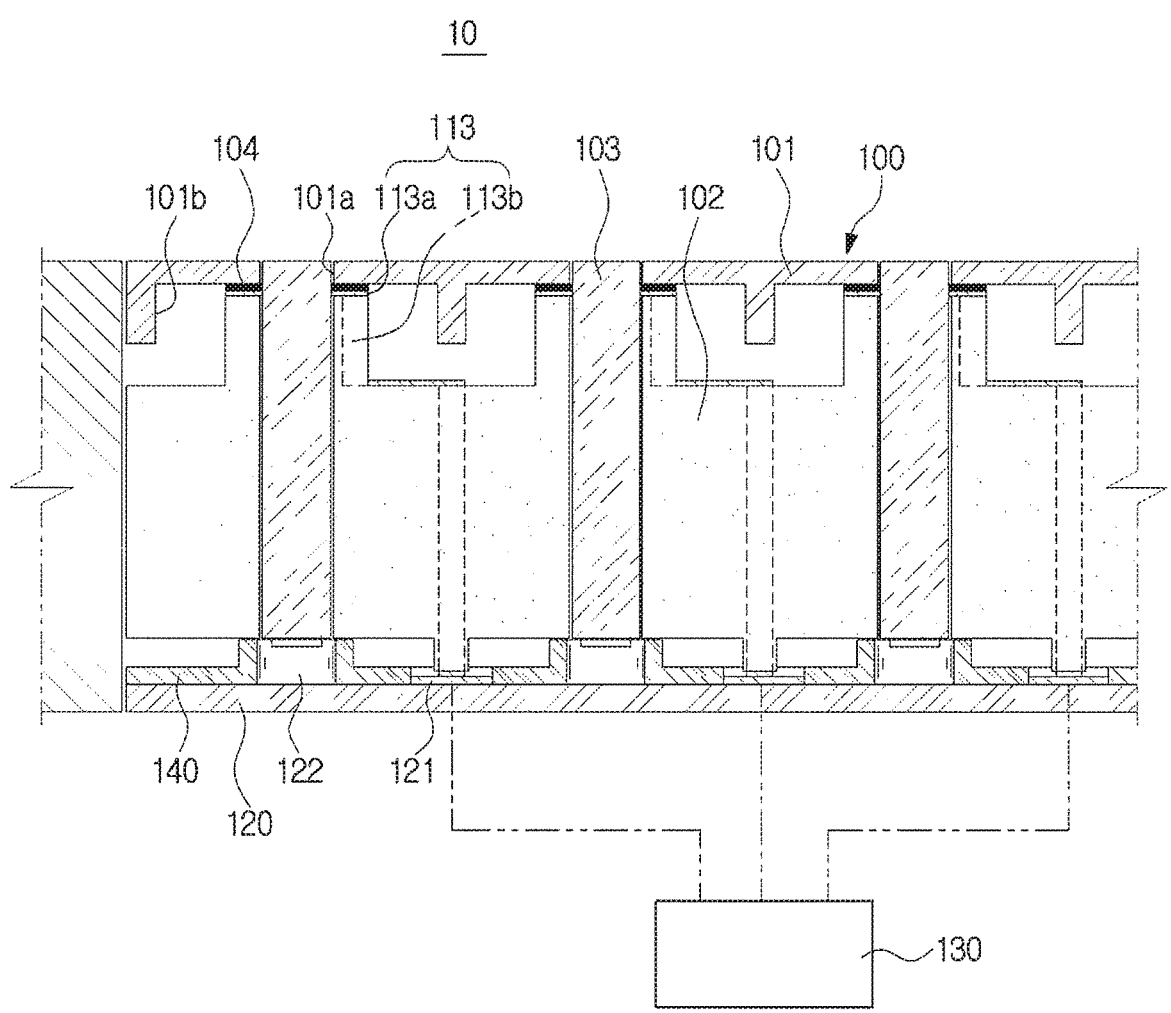
FIG. 1 is a cross-sectional view illustrating a combined touch control device, according to an embodiment of the present disclosure.
Figure 2:
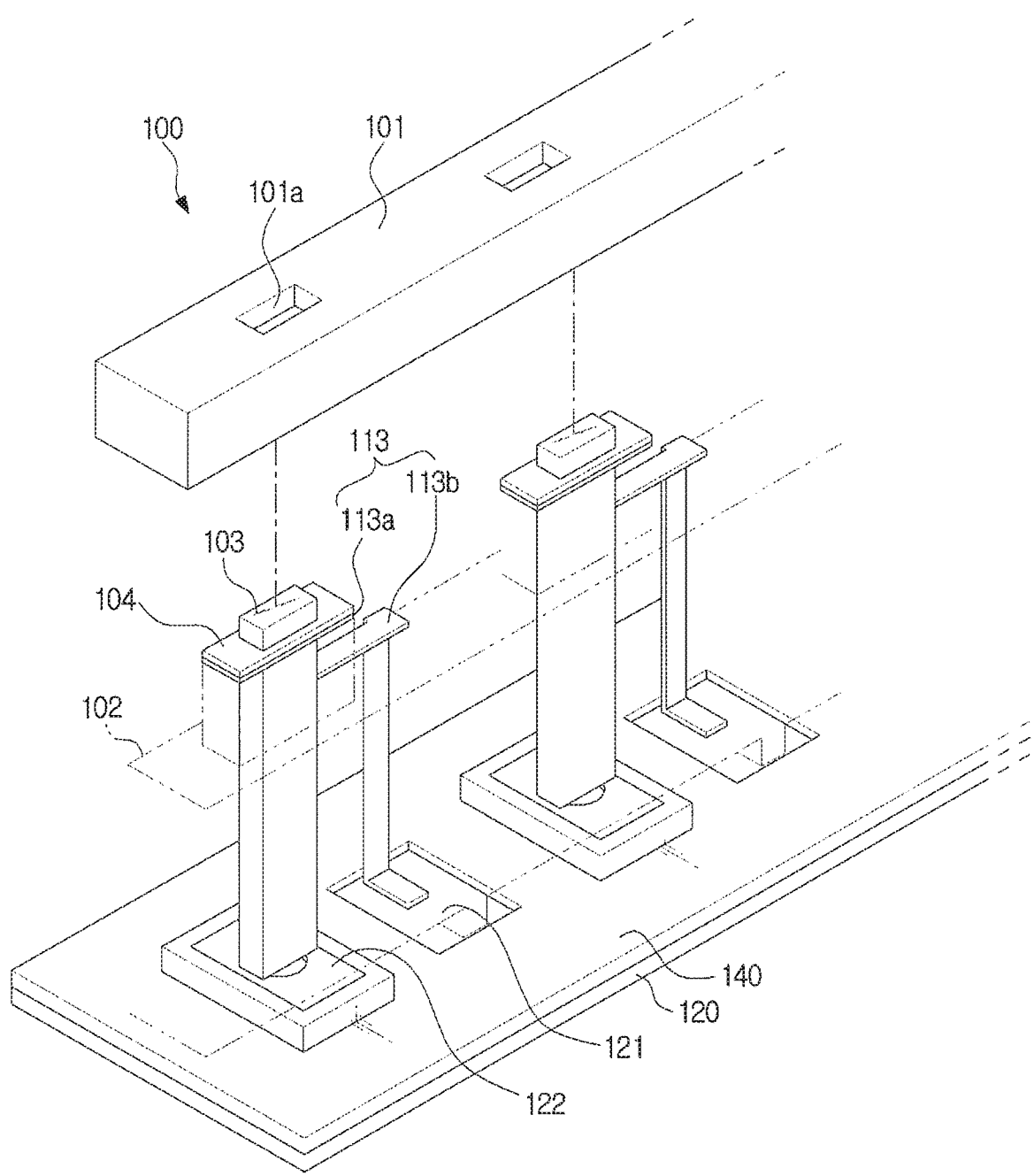
FIG. 2 is a perspective view of a button.
Figure 3:
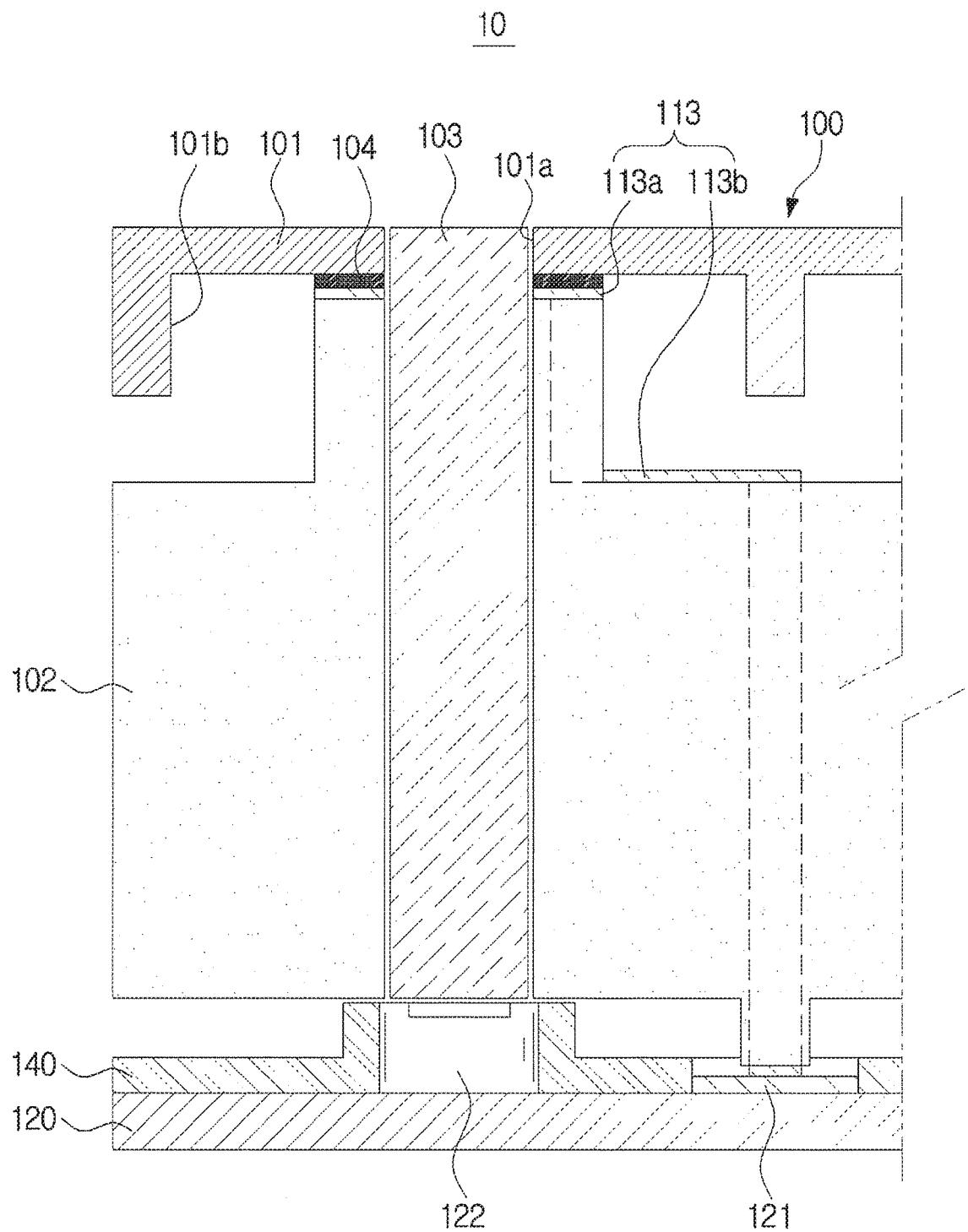
FIG. 3 is an enlarged view of FIG. 1.

FIG. 1 is a cross-sectional view illustrating a combined touch control device according to an embodiment of the present disclosure, FIG. 2 is a perspective view of a button, and FIG. 3 is an enlarged view of FIG. 1.

Referring to FIG. 1, a touch input device 10 may include a button 100 receiving a touch signal from an input means, a signal deliverer 113 for detecting contact of the input means, a substrate 120 equipped with a receiver 121 for receiving signals from the signal deliverer 113, a sealing member 140 arranged between the substrate 120 and the button 100, and a controller 130 for receiving information about capacitance delivered from the receiver 121 and determining input information.

Referring to FIG. 2, the button 100 may include a button member 101 with which an input means comes into contact, and a body member 102 arranged between the button member 101 and the substrate 120 and have the signal deliverer 113 formed therein.

The input means herein may include a finger of the user, a touch pen, or the like. Contact (or touch) may be defined herein to imply both direct contact and indirect contact. Specifically, the direct contact means an event when the input means touches the touch control device 10, and the indirect contact means an event when the input means approaches into a range in which the controller 130 is able to detect an object although not touching the input control device 10.

The button member 101 has a top face exposed to the outside of a mounting face for the input means to come into contact with, and a bottom face hidden inside the mounting face. The button member 101 may have a flat rectangular form as shown in the drawings, or have any other flat form such as a flat circular or flat bar form.

Although the top and bottom faces of the button member 101 are shown as being flat in the drawings, they may be convexly or concavely curved in other embodiments. The curved face of the button member 101 may include a curved face with a constant curvature and a curved face with changing curvatures. The curved face of the button member 101 may include two or more curvatures, and different curved directions depending on coordinates.

Alternatively, the top and bottom faces of the button member 101 may be inclined.

The button member 101 may be formed of metal. For example, it may use aluminum, stainless (SUS), or the like. Using metal as a material for the button member 101 may give the button member 101 a luxurious feel.

The button member 101 may be formed of wood, leather, etc.

The button member 101 may form a concave space 101b in the bottom. A part of the body member 102 may be received in the concave space 101b. Reception of the body member 102 in the concave space 101b of the button member 101 may reduce the height of the button 100.

The body member 102 is placed below the button member 101. Specifically, the body member 102 may be arranged between the button member 101 and the substrate 120. For example, the top part of the body member 102 may be received in the concave space 101b formed in the bottom of the button member 101.

A plurality of body members 102 may also be received in a single button member 101. In this case, the respective body members 102 may have signal deliverers 113 separately. Accordingly, the respective body members 102 may recognize different touch signals.

Furthermore, the touch control device 10 may include a light emitting member 122 for emitting light, and a light transfer member 103 exposed to the outside through an opening 101a of the button member 101 for serving as a path through which light emitted from the light emitting member 122 is transferred.

The button member 101 may be formed of an opaque material. For example, if the button member 101 is formed of metal, light does not pass the button member 101. Accordingly, the light from the emitting member 122 may pass through the opening 101a of the button member 101.

The light transfer member 103 may be exposed to the outside through the opening 101a formed in the button member 101. The light transfer member 103 may be placed on top of the light emitting member 122. For example, the opening 101a may be located above and perpendicular to the light emitting member 122, and the light transfer member 103 may extend in a direction perpendicular to the light emitting member 122 and may be received in the opening 101a.

The light transfer member 103 may be formed of a light-transmissive material. Light transmittance may depend on needs. In other words, the light transfer member 103 may be formed of not only a transparent material but also a translucent material.

Furthermore, the light transfer member 103 may be formed to bore through the body member 102. For example, the light transfer member 103 may bore through the body member 102 in the vertical direction. The light transfer member 103 may be formed such that the top faces the light emitting member 122 and the bottom faces the opening 101a formed in the button member 101. The top of the light transfer member 103 may be arranged to be received in the opening 101a.

The light emitting member 122 may be placed on a substrate 120. The light emitting member 122 may be electrically connected to the substrate 120. Alternatively, the light emitting member 122 may be placed separately from the substrate 120 and receive power, or the light emitting member 122 may emit light without reception of power.

The light emitting member 122 may emit light, which may be transferred through the light transfer member 102 to the outside. Accordingly, the user may see the light through the light transfer member 103 exposed through the opening 101a of the button member 101. For example, the light emitting member 122 may use e.g., a light emitting diode (LED).

The opening 101a of the button member 101 may be shaped like a label. For example, when viewed from above, the opening 101a may be shaped like a letter, a number, a symbol, or the like. Light emitted from the light emitting member 122 may penetrate the opening 101a functioning as a label.

The signal deliverer 113 may be formed to have capacitance changed when the input means approaches or touches the touch control device 10.

The signal deliverer 113 may include a first signal deliverer 113a arranged to be adjacent to the button member 101, and a second signal deliverer 113b extending from the first signal deliverer 113a and arranged to be adjacent to the receiver 121. Being adjacently arranged may include coming into contact. For example, in the drawings, the second signal deliverer 113b and the receiver 121 come into contact with each other.

Furthermore, the s and second signal deliverers 113a and 113b may be integrally formed.

The first signal deliverer 113a may occupy a large area below the button member 101. The size of a touch area through which a signal is input from the input means may be determined depending on the size of the area of the first signal deliverer 113a. For example, the first signal deliverer 113a may be arranged on the top face of the body member 102 received in the concave space 101b formed in the bottom of the button member 101.

The second signal deliverer 113b may extend downward along the lateral side of the body member 102. One end of the second signal deliverer 113b may be connected to the first signal deliverer 113a and may extend even near to the receiver 121. Alternatively, the second signal deliverer 113b may be connected to the receiver 121.

The touch control device 10 may further include a shielding member 104 arranged between the button member 101 and the first signal deliverer 113a. The shielding member 104 may be arranged to block electric interference between the button member 101 and the first signal deliverer 113a. For example, if the button member 101 is formed of metal and the button member 101 and the first signal deliverer 113a are in a state of coming into contact with each other, changes of capacitance of the first signal deliverer 113a may not constant when the input means approaches or contacts the touch control device 10.

Hereinafter, forming of the signal deliverer 113 in the body member 102 will be described.

Figure 4:
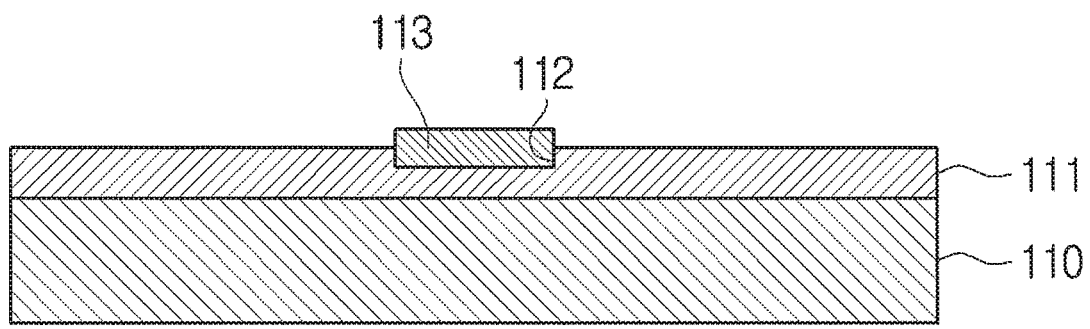
FIG. 4 is a cross-sectional view for explaining how a signal deliverer is formed in a button.

FIG. 4 is a cross-sectional view for explaining how a signal deliverer is formed in the button.

Referring to FIG. 4, the signal deliverer 113 may be arranged in an electrode groove 112 formed in the body member 102.

The body member 102 may include a basic member 110, a base 111 coated on one side of the basic member 110, and the electrode groove 112 concavely formed on one side of the base 111.

The signal deliverer 113 may be formed on the base 111 using a laser directing structure (LDS) method. The LDS method refers to a method of forming a conductive structure in a region of a supporter member exposed to laser by forming the supporter member with a material including a non-conductive and chemically stable metal complex, exposing a metal seed by exposing a portion of the supporting member to laser, such as Ultra Violet (UV) laser or Excimer laser to break chemical bonding of the metal complex, and metalizing the supporting member.

The signal deliverer 113 is formed of a conductive material, e.g., a metal. Especially, among metals, copper Cu may be used taking into account conductivity and economic efficiency. In another example, the signal deliverer 113 may be formed of other metals than copper, such as gold.

The base 111 may include a metal complex. For example, the base 111 may be a complex including resin and metal oxide. The resins may include one or more of Polycarbonate (PC), Polyamide (PA), and acrylonitrile-butadiene-styrene copolymer (ABS), and the metal oxides may include one or more of Mg, Cr, Cu, Ba, Fe, Ti, and Al.

Alternatively, unlike what is shown in the drawings, the base 111 may be integrally formed with the basic member 110. In this case, the basic member 110 may include a metal complex.

The electrode groove 112 for receiving the signal deliverer 113 is formed on one side of the base 111. That is, the signal deliverer 113 may be formed to fill the electrode groove 112.

The electrode groove 112 is formed by irradiating laser on the one side of the base 111. In this case, the base 111 is reduced to the metal by heat generated while the groove is formed, and the portion reduced to the metal forms a metal seed in the electrode groove 112.

The signal deliverer 113 is formed by being plated on the electrode groove 112. A plating process on the metal seed may use a technology commonly known to the public, so the details will be omitted herein. Alternatively, the signal deliverer 113 may be formed by a deposition process. In another example, it may also be formed by a combination of the plating and deposition processes. In the following, it is assumed that the signal deliverer 113 is formed by the plating process.

The signal deliverer 113 may include a copper plating, and may further plate the copper plating with nickel (Ni) to prevent oxidization. When gold plating is used, it may improve conductivity.

The base 111 may be formed by being coated on one side of the basic member 110 formed of any of various materials. The basic member 110 may include resin, glass, or leather. The basic member 110 may have stiff or elastic surfaces. Furthermore, the basic member 110 may be rigid or flexible. The basic member 110 may be formed in an injection molding method. For example, the basic member 110 may be formed in any shape through injection, and the base 111 including a metal oxide may be coated on the top or the bottom of the basic member 110.

As described above, the button member 101 may be curvedly formed. In this case, the first signal deliverer 113a may be curved depending on the curvature of the touch face.

The base 111 may include a curved face depending on the shape of the basic member 110. For example, a face of the base 111 may have a partially spherical form. The electrode groove 112 may be formed on the curved face of the base 111. In this regard, since the electrode groove 112 is formed using laser, the electrode groove 112 may have a complicated form regardless of the shape of the base 111.

The signal deliverer 113 is plated on the electrode groove 112. In this regard, by nature of the plating process, the signal deliverer 113 may be plated regardless of the shape of the electrode groove 112, which makes it easy to plate the signal deliverer 113 even if the electrode groove 112 is not formed to be straight or planar.

The signal deliverer 113 may have some of the bottom part received in the electrode groove 112 and a portion of the top part protrudes above the electrode groove 112. For example, a half of the signal deliverer 113 may be received in the electrode groove 112, and the other half may protrude above the electrode groove 112.

Next, how to form the signal deliverer 113 will now be described.

The basic member 110 may be formed in an injection molding method. The basic member 110 may also be formed by injecting a metal complex.

The base 111 may also be formed by coating one side of the basic member 110 with a metal complex. Alternatively, the base 111 may be integrally formed with the basic member 110 formed of a metal complex.

The electrode groove 112 may be formed by irradiating laser, such as UV laser or excimer laser onto one face of the base 111. In this case, the heat generated while the groove is formed breaks the chemical bonding of the metal complex to be reduced to a metal, forming a metal seed in the electrode groove 112.

The electrode groove 112 may be formed on a curved face of the base 111. Since the groove is formed by laser irradiation, various patterns may be made without regard to the surface form of the base 111.

The signal deliverer 113 may be formed by metalizing the electrode groove 112 that exposes the metal seed. The metallization process may be based on plating or deposition.

Turning back to FIGS. 1 to 3, the receiver 121 for receiving information about a change in capacitance of the signal deliverer 113 may be formed on the substrate 120. For example, the substrate 120 may be a Printed Circuit Board (PCB).

The receiver 121 may be formed of a conductive material, e.g., a metal. Especially, among metals, copper Cu may be used taking into account conductivity and economic efficiency. In another example, the receiver 121 may be formed of other metals than copper, such as gold.

Information about the change in capacitance of the signal deliverer 113 input through the receiver 121 may be sent to the controller 130 connected to the receiver 121. The controller 130 will further be described later.

The receiver 121 may be formed in a laser directing structure (LDS) method. For example, the base 111 including a metal complex may be coated on one side of the substrate 120, or alternatively, the substrate 120 may include the metal complex, A groove in which the receiver 121 is to be formed may then be formed using laser. The receiver 121 may then be formed through plating or deposition.

The sealing member 140 may be formed to cover the top of the substrate 120, thus performing antisoil and waterproof functions. That is, the sealing member 140 may protect the substrate 120 against outside contaminants. The sealing member 140 may protect the substrate 120 against foreign materials that might come into gaps around the button 100, thereby preventing malfunction. For example, the sealing member 140 may be formed of a material such as rubber or vinyl.

The sealing member 140 may generally have the form of a wide plate or a film, and have a deformable portion that supports the button 100.

The sealing member 140 may be arranged to cover the receiver 121 or the light emitting member 122. For example, the sealing member 140 may be arranged between the receiver 121 and the signal deliverer 113, and between the light emitting member 122 and the light transfer member 103.

Figure 5:
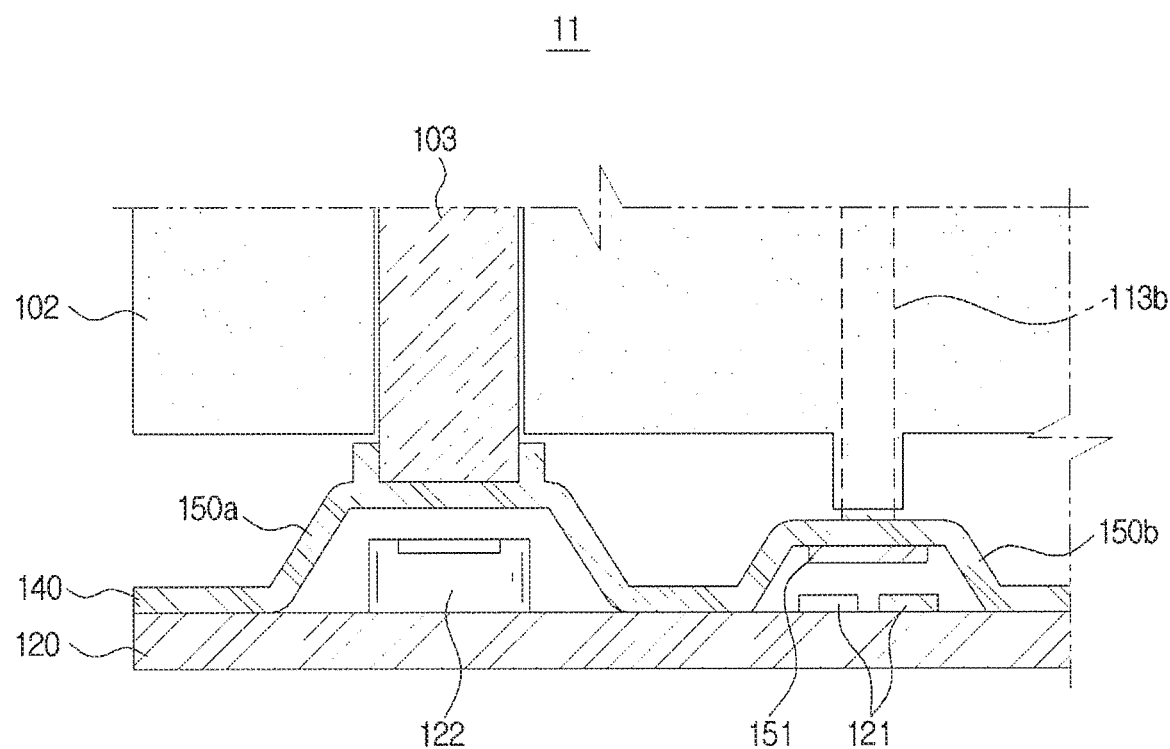
FIG. 5 is a cross-sectional view illustrating a touch control device, according to another embodiment of the present disclosure.

FIG. 5 is a cross-sectional view of a touch control device 11, according to a second embodiment of the present disclosure.

Referring to FIG. 5, the touch control device 11 in accordance with the second embodiment of the present disclosure may have a pressable form. The touch control device 11 may not only receive a touch input signal of the input means, but also receive a mechanical input signal generated when the input means pushes down the button 100. As such, by enabling both the touch signal and mechanical signal to be inputted, control feel may be provided for the user, and various execution commands may be enabled.

The button 100 may be formed to be reversibly moved down. Accordingly, the button 100 may be arranged to be separate from the substrate 120 and an elastic member 150 may further be included between the button 100 and the substrate 120.

That is, the elastic member 150 may be arranged between the button 100 and the substrate 120. The elastic member 150 may be formed to support the button 100 and may provide repulsive force while being elastically deformed as the button 110 is moved down by an external force. The repulsive force may give a control feel for the user.

When the external force is relieved, the elastic member 150 is restored to its original form and the button 100 is moved to its original position.

The elastic member 150 may be integrally formed with the sealing member 140, or may be formed separately from the sealing member 140. For example, the elastic member 150 may be a region provided so as to provide an elastic power by changing the shape of the sealing member 140. If the sealing member 140 is formed of rubber, the sealing member 140 may provide elastic power in the area to support the button 100, which may act on the elastic member 150.

The elastic member 150 may be arranged to support the button 100.

Specifically, the elastic member 150 may include a first elastic member 150a formed to support the light transfer member 103. For example, the first elastic member 150a may have a pillar form, and a lateral side of the first elastic member 150a may be inclined to be always easily deformed.

The top of the elastic member 150 may be concaved to receive a part of the button 100. For example, if the cross-section of the light transfer member 103 has a rectangular form, a rectangular groove is formed on the top of the first elastic member 150a for the light transfer member 103 to be inserted thereto.

Furthermore, the elastic member 150 may include a second elastic member 150b formed to support the button member 101 with the signal deliverer 113 formed therein. For example, the second elastic member 150b may have a pillar form, and a lateral side of the second elastic member 150a may be inclined to be always easily deformed.

A resistive member 151 may be attached onto the bottom of the second elastic member 150b. The resistive member 151 may be formed of a conductive material, e.g., a metal.

The resistive member 151 may be located in a position to correspond to the receiver 121. As the button 100 is moved down by an external force, the resistive member 151 may come into contact with the receiver 121 while the elastic member 150 is elastically deformed. When the external force is relieved, the elastic member 150 is restored to its original form and the resistive member 151 is detached from the receiver 121.

The resistive member 151 may perform ON/Off functions of the touch control device 10.

When the resistive member 151 comes into contact with the receiver 121, a current or voltage at the receiver 121 may be changed. The controller 130 may determine from the change in current or voltage at the receiver 121 whether the resistive member 151 comes into contact with the receiver 121. Specifically, the controller 130 may determine that the touch control device 10 is in the ON state when the resistive member 151 contacts the receivers 121, and determine that the touch control device 10 is in the Off state when the resistive member 151 is detached from the receivers 121.

There may be a plurality of receivers 121 separated from one another. In this case, if the resistive member 151 simultaneously comes into contact with the receivers 121 separated from one another, a current may flow in the receivers 121. The controller 130 may determine whether the resistive member 151 comes into contact with the receivers 121, based on whether a current flows in the receivers 121. Specifically, the controller 130 may determine that the touch control device 10 is in the ON state when the resistive member 151 contacts the receivers 121, and determine that the touch control device 10 is in the Off state when the resistive member 151 is detached from the receivers 121.

The receiver 121 may be formed to have changing capacitance between itself and the signal deliverer 113. For example, the capacitance may be changed as the distance between the receiver 121 and the signal deliverer 113 is changed according to the up or down movement of the button 100.

Information about an extent of change in capacitance of the signal deliverer 113 input through the receiver 121 or information about capacitance between the receiver 121 and the signal deliverer 113 may be sent to the controller 130 connected to the receiver 121.

Figure 6:
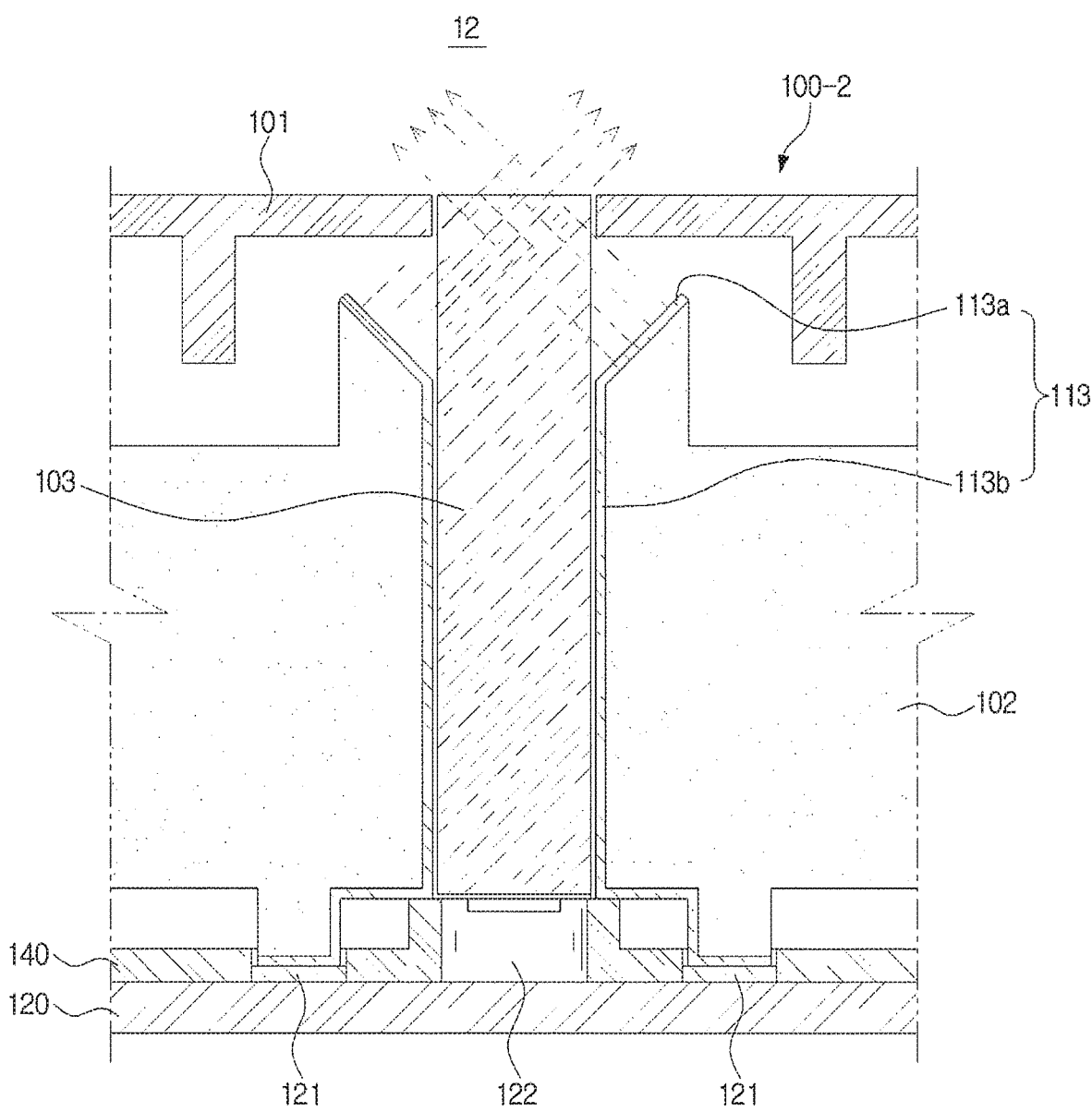
FIG. 6 is a cross-sectional view of a touch control device, according to another embodiment of the present disclosure.

FIG. 6 is a cross-sectional view of a touch control device 12, according to a third embodiment of the present disclosure.

The touch control device 12 in accordance with the third embodiment of the present disclosure may have a first signal deliverer 113a formed in a curved plane.

The light transfer member 103 may be formed to bore through the body member 102, and the body member 102 may have the inclined top face that the light transfer member 103 bores through. A direction and angle of the inclination may be toward an opening 101a.

The first signal deliverer 113a may be arranged on the inclined face of the body member 102. The second signal deliverer 113b may have one end connected to the first signal deliverer 113a and the other end located near or in contact with the receiver 121.

Furthermore, the second signal deliverer 113b may be formed around a through part of the body member 102 through which the light transfer member 103 bores. The second signal deliverer 113b may extend outward from the bottom face of the through part. The second signal deliverer 113b may also extend to vertically correspond to a position of the receiver 121 from the bottom face of the through part.

The receiver 121 may be arranged outside of the light emitting member 122. For example, the receiver 121 may be arranged to surround the light emitting member 122, and the second signal deliverer 113b may extend around the bore part of the body member 102.

Figure 7:
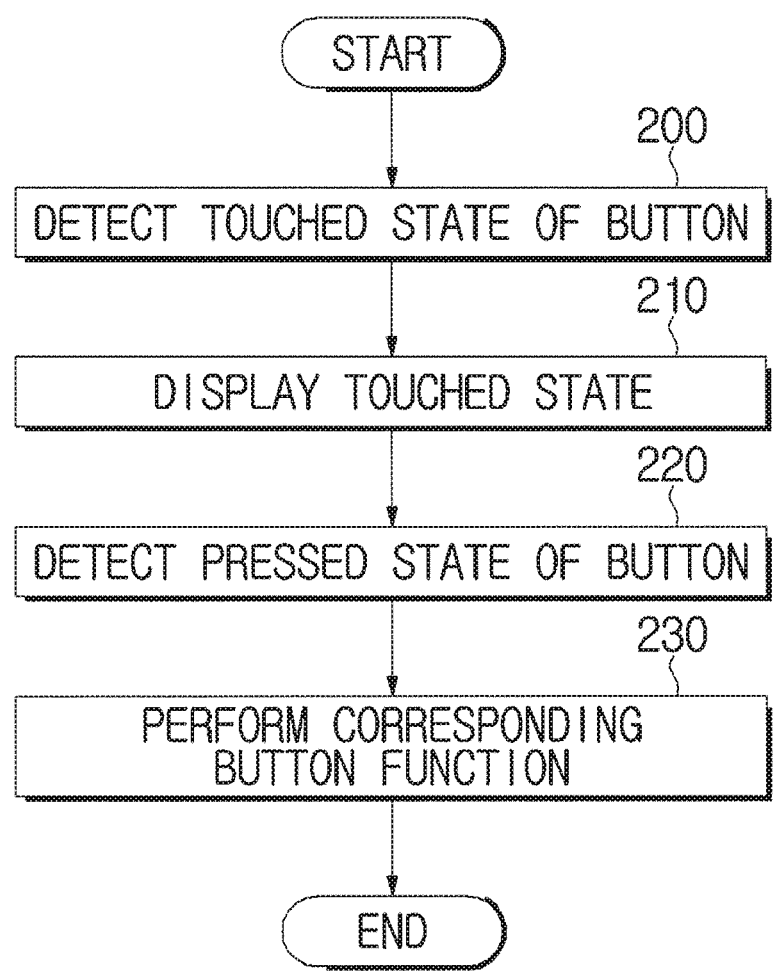
FIG. 7 is a flowchart illustrating a method for controlling a touch control device, according to an embodiment of the present disclosure.

FIG. 7 is a flowchart illustrating a method for controlling the touch control device 10, according to an embodiment of the present disclosure.

Referring to FIG. 7, if an input means, such as a finger of the user or a touch pen touches the button 100, capacitance between the signal deliverer 113 and the receiver 121 is changed. Information about the change of capacitance is then delivered to the controller 130 connected to the receiver 121, and the controller 130 determines that the input means is in contact with the button 100, in 200.

If the received information about the change of capacitance is in a first capacitance range stored, the controller 130 determines that the input means comes into contact with the button 100, and displays the touched state, in 210. For example, the controller 130 may display the touched state by displaying an icon on a display or an HUD or by providing an alarm in a voice message.

Furthermore, when the input means presses the button 100 by applying an external force, the capacitance between the signal deliverer 113 and the receiver 121 is changed. Information about the change of capacitance is then delivered to the controller 130 connected to the receiver 121, and the controller 130 determines that the input means presses and holds the button 100, in 220.

If the received information about the change of capacitance is in a second capacitance range stored, the controller 130 determines that the input means presses the button 100, and performs a corresponding function of the button 100, in 230.

Two methods may be used for the controller 130 to determine whether the button 100 is pressed. The first method is to determine that the button 100 is pressed from a change in current voltage that occurs when the resistive member 151 comes into contact with the receiver 121, and the second method is to determine that the button 100 is pressed from a change in capacitance. In this regard, the capacitance between the signal deliverer 113 and the receiver 121 may have a smaller value than in the touched state.

The control method may prevent malfunction from unintentional touches. In a case where the user is not familiar to the function of the button 100, the function of the button 100 may be displayed. For example, if the input means touches the button 100, the function of the button 100 may be displayed on a display or HUD, or may be informed through a voice message. When the input means presses the button 100 after that, it is interpreted that the user is aware of the function of the button 100, and thus the function of the button 100 may be performed.

Figure 8:
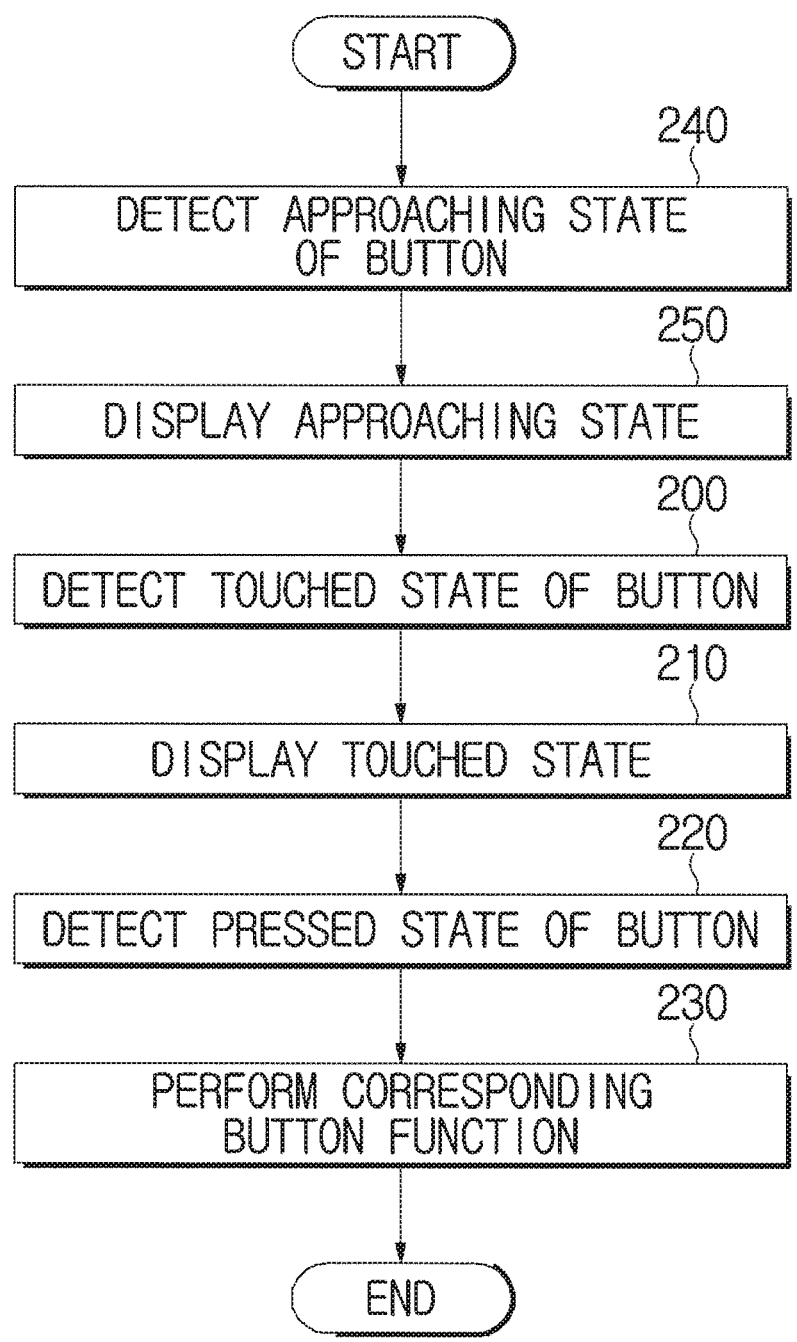
FIG. 8 is a flowchart illustrating a method for controlling a touch control device, according to another embodiment of the present disclosure.

FIG. 8 is a flowchart illustrating a method for controlling the touch control device 10, according to another embodiment of the present disclosure.

Referring to FIG. 8, if an input means, such as a finger of the user or a touch pen approaches the button 100 in operation 240, capacitance between the signal deliverer 113 and the receiver 121 is changed. Information about the change of capacitance is then delivered to the controller 130 connected to the receiver 121, and the controller 130 determines that the input means approaches the button 100, in 240.

If the received information about the change of capacitance in a third capacitance range stored, the controller 130 determines that the input means is located in a range close to the button 100, and displays the approaching state for the user, in 250. For example, the controller 130 may display the approaching state by displaying an icon on a display or a head-up display (HUD) or by providing an alarm in a voice message. In this regard, the capacitance between the signal deliverer 113 and the receiver 121 may have a larger value than in the touched state.

Furthermore, when the input means touches the button 100, the capacitance between the signal deliverer 113 and the receiver 121 is changed. Information about the change of capacitance is then delivered to the controller 130 connected to the receiver 121, and the controller 130 determines that the input means is in contact with the button 100, in 200.

If the received information about the change of capacitance is in a first capacitance range stored, the controller 130 determines that the input means comes into contact with the button 100, and displays the touched state, in 210. For example, the controller 130 may display the touched state by displaying an icon on a display or an HUD or by providing an alarm in a voice message.

Furthermore, when the input means presses the button 100 by applying an external force, the capacitance between the signal deliverer 113 and the receiver 121 is changed. Information about the change of capacitance is then delivered to the controller 130 connected to the receiver 121, and the controller 130 determines that the input means presses and holds the button 100, in 220.

If the received information about the change of capacitance is in a second capacitance range stored, the controller 130 determines that the input means presses the button 100, and performs a corresponding function of the button 100, in 230.

Figure 9:
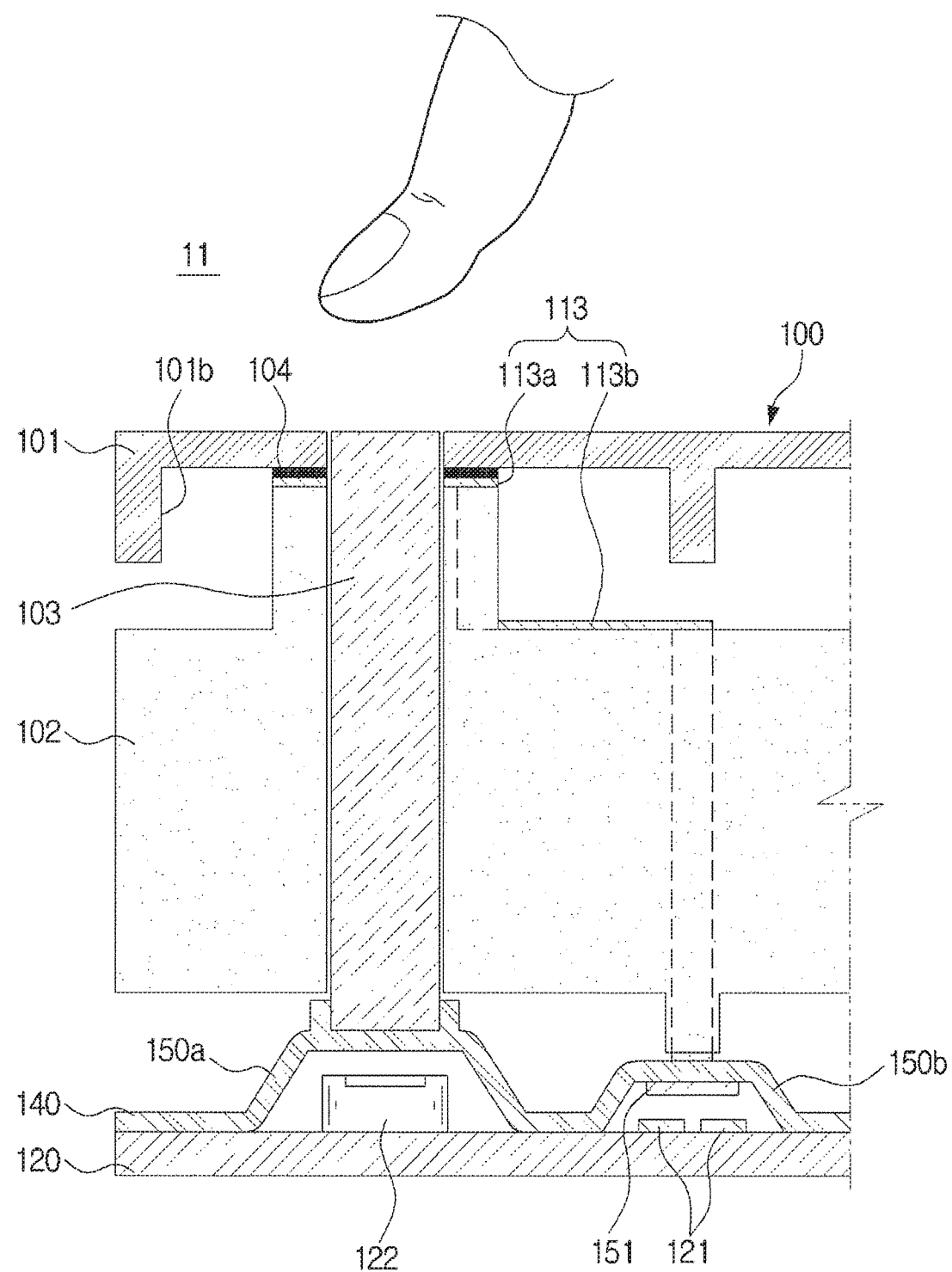
FIG. 9 illustrates a finger of a user approaching a touch control device.

Next, how the touch control device 10 operates will now be described in connection with FIGS. 9 to 11. FIG. 9 illustrates a finger of the user approaching the touch control device 10, FIG. 10 illustrates a finger of the user coming into contact with the touch control device 10, and FIG. 11 illustrates a user pressing and holding the touch control device 10.

FIG. 9 illustrates the input means approaching within a certain distance to the button member 101. Even with the input means approaching within the certain distance before coming into contact with the button member 101, the capacitance between the signal deliverer 113 and the receiver 121 is changed. The controller 130 may determine that the input means approaches the button member 101 if the capacitance is changed in the first range.

Figure 10:
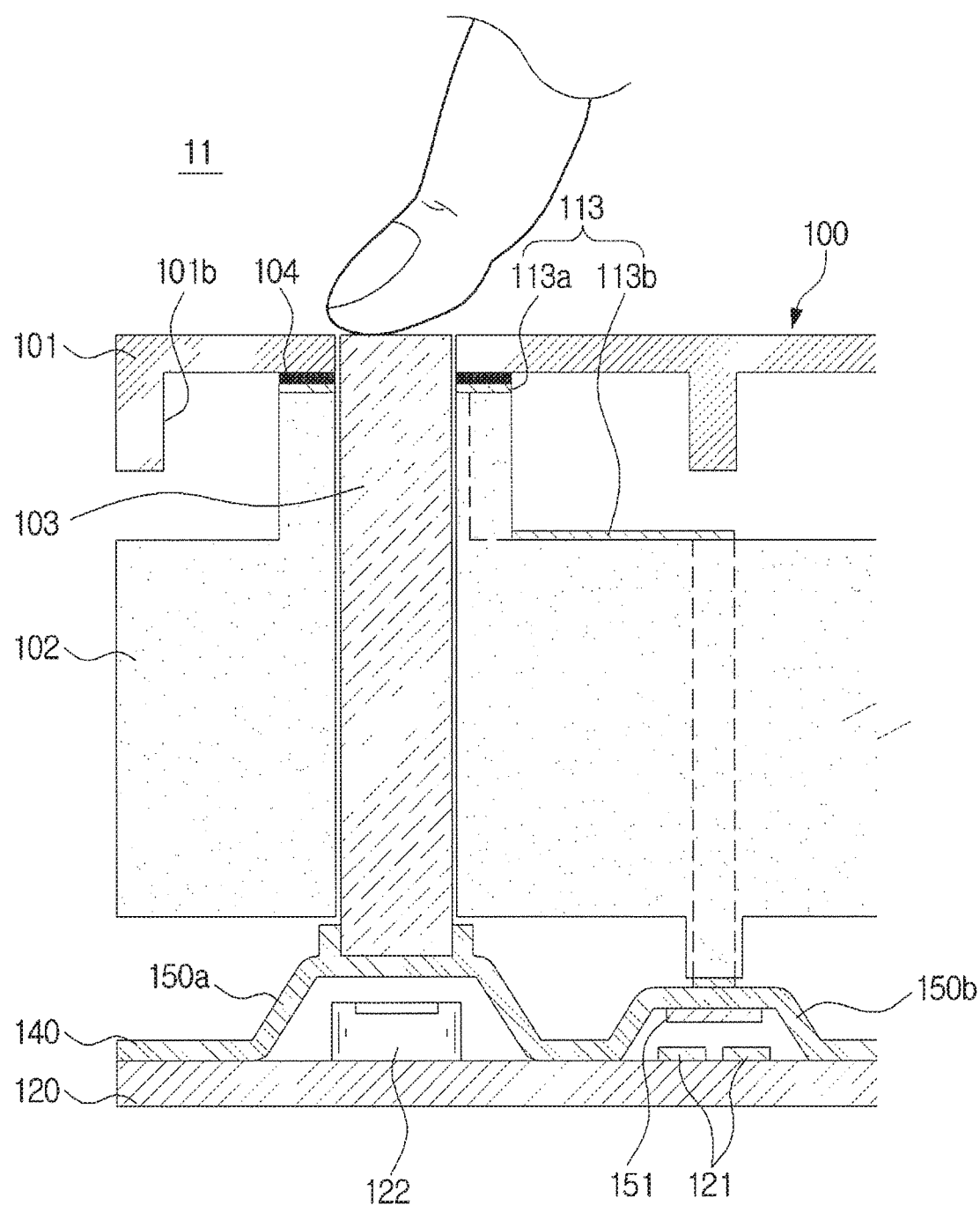
FIG. 10 illustrates a finger of a user coming into contact with a touch control device.

FIG. 10 illustrates the input means touching the button member 101. The controller 130 may determine that the input means comes into contact with the button member 101 if the capacitance is changed in the second range.

Figure 11:
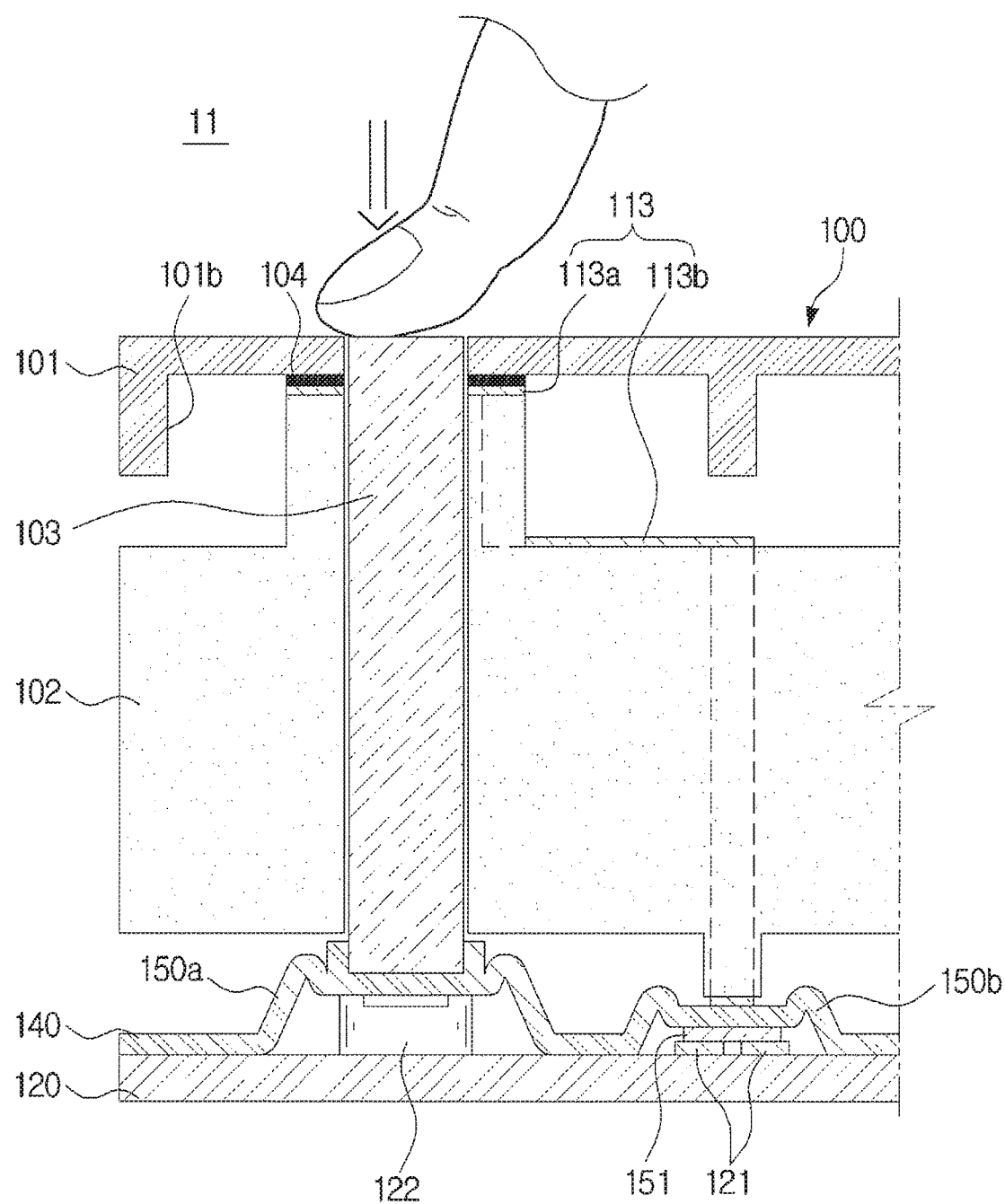
FIG. 11 illustrates a user pressing a touch control device.

FIG. 11 illustrates the button 100 pressed by an external force applied by the input means. The controller 130 may determine that the button 100 has been pressed if the capacitance is in the third range.

Figure 12:
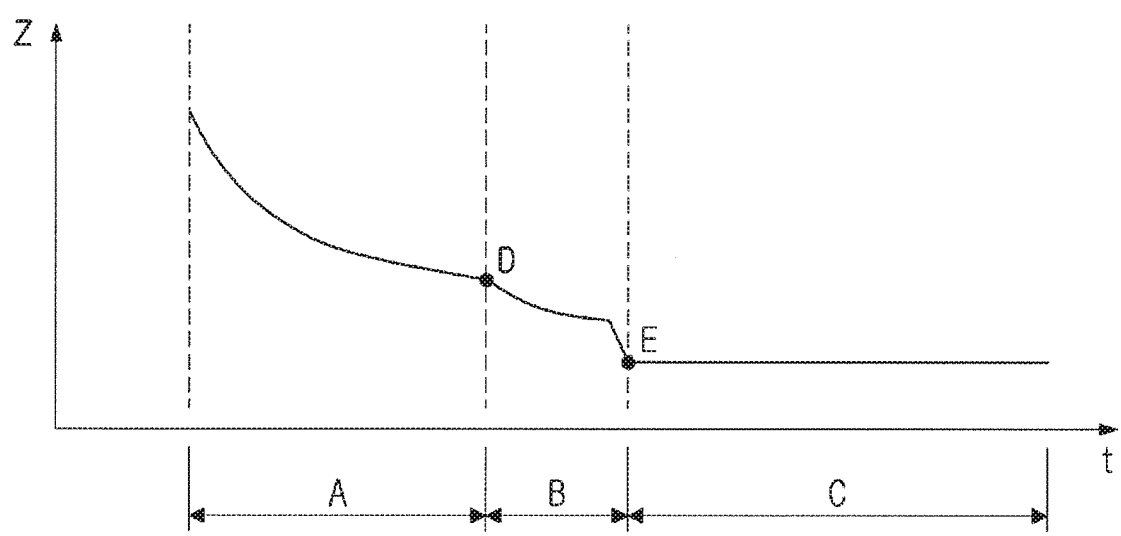
FIG. 12 is a graph representing impedance changed in the process of FIGS. 9 to 11.

FIG. 12 is a graph representing impedance changed in the process of FIGS. 9 to 11.

The y-axis represents total impedance and the x-axis represents changes in time.

Section A represents a state in which the input means approaches the button member 101, approaching closer to the button member 101 as time goes by (to the right on the x-axis). The closer the input means approaches to the button member 101, the smaller the total impedance becomes.

Section B represents a state in which the input means comes into contact with the button member 101, and the extent to which the button 100 is pressed becomes larger as time goes by (to the right on the x-axis). The larger the extent to which the button 100 is pressed, i.e., the closer the signal deliverer 113 approaches to the receiver 121, the smaller the total impedance becomes.

Point D, a border between the sections A and B, represents a moment when the input means comes into contact with the button member 101.

Section C represents a state in which the button 100 is fully pressed, and the total impedance is not changed with time.

Point E, a border between the sections B and C, represents a moment when the resistive member 151 comes into contact with the receiver 121.

The touch control device according to embodiments of the present disclosure may be manufactured using an LDS method, thereby simplifying the manufacturing process and reducing processing costs.

The touch control device may be safe from vibration and shock and may have improved durability, by not using any adhesion process in forming the sensing patterns on a base.

Moreover, since the touch control device is manufactured under a high heat condition using laser, it may have improved reliability even when the product of the touch control device is used in high-temperature environments.

The touch control device may also enable touch functions to be performed even using metal, wooden, or leather buttons.

The touch control device may also be easily identified using a light transfer member.

Furthermore, the touch control device may provide feeling of manipulation for the user by adding physical buttons to touch buttons.

In addition, the touch control device may provide various functions by enabling the physical and touch buttons to be used together or selectively, thereby improving user convenience.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A touch control device comprising:
a button member receiving a touch input and having an opening;
a body member located below the button member;
a signal deliverer arranged in the body member for having a capacitance that changes when the touch input approaches or touches the button member;
a substrate having a receiver which is arranged on the substrate for receiving information about the capacitance from the signal deliverer;
a light emitting member for irradiating light onto the button member; and
a light transfer member passing through the body member and configured to guide light from the light emitting member to the opening,
wherein the signal deliverer is composed of a conductive material and includes:
a first signal deliverer disposed adjacent to the button member around the light transfer member; and
a second signal deliverer extending from the first signal deliverer to the receiver and delivering the information about the capacitance to the receiver,
wherein the first signal deliverer is arranged on a top face of the body member through which the light transfer member extends, and
the second signal deliverer has one end connected to the first signal deliverer and another end connected to the receiver.

2. The touch control device of claim 1, wherein the body member has a side including a metal complex, in which an electrode groove is defined, and
wherein the signal deliverer having the conductive material is arranged in the electrode groove.

3. The touch control device of claim 2, wherein the body member comprises a resin including one or more of polycarbonate (PC), polyamide (PA), or acrylonitrile-butadiene-styrene copolymer (ABS), and metal oxide including one or more of Mg, Cr, Cu, Ba, Fe, Ti, or Al.

4. The touch control device of claim 2, wherein the body member includes a base, which has the metal complex, coated on one side of a basic member.

5. The touch control device of claim 1, wherein the button member is composed of a metal.

6. The touch control device of claim 5, further comprising a shielding member isolating the button member from the signal deliverer.

7. The touch control device of claim 1, further comprising a controller for determining the information about the capacitance received from the receiver.

8. The touch control device of claim 7, wherein the controller determines whether the touch input comes into contact with the button from the information about the capacitance between the signal deliverer and the receiver.

9. The touch control device of claim 8, wherein the controller determines whether the touch input approaches the button within a predetermined range based on the information about the capacitance between the signal deliverer and the receiver.

10. The touch control device of claim 1, wherein the body member is separated from the substrate,
wherein the touch control device further comprises an elastic member disposed between the body member and the substrate, and
wherein the button member and the body member are arranged to be movable in a vertical direction to press the elastic member.

11. The touch control device of claim 1,
wherein the light transfer member passes through the body member, and the body member has an inclined face around the light transfer member,
wherein the first signal deliverer is arranged on the inclined face, and
wherein the second signal deliverer has one end connected to the first signal deliverer and another end extending toward the receiver.

12. The touch control device of claim 11, wherein some area of the first signal deliverer faces the opening of the button member.

13. The touch control device of claim 1, wherein the light transfer member passes through the body member,
wherein the first signal deliverer is arranged on a face adjacent to the button member, and
the second signal deliverer extends around a through part of the body member, through which the light transfer member extends, toward the receiver.

14. A touch control device comprising:
a button member defining a touch area which is touchable, the button member composed of a metal and having an opening;
a substrate having a receiver arranged on the substrate for receiving a touch signal;

a body member disposed between the button member and the substrate;

a light emitting member for irradiating light;

a light transfer member passing through the body member and configured to guide light from the light emitting member to the opening; and a signal deliverer comprising:

a first signal deliverer arranged in the body member to be adjacent to the button member around the light transfer member, the first signal deliverer having a capacitance that changes when a touch input approaches or touches the button member; and a second signal deliverer extending from the first signal deliverer toward the receiver to deliver information about the capacitance of the first signal deliverer to the receiver, wherein the first signal deliverer is arranged on a top face of the body member through which the light transfer member extends, the second signal deliverer has one end connected to the first signal deliverer and another end extending toward the receiver, and wherein the receiver receives the information about the capacitance of the first signal deliverer changed by the touch input.

15. The touch control device of claim 14, wherein the first signal deliverer is arranged around a through part of the body member, through which the light transfer member extends.

* * * * *